United States Patent
Farbiz et al.

(10) Patent No.: US 9,431,384 B2
(45) Date of Patent: Aug. 30, 2016

(54) PROGRAMMABLE ESD PROTECTION CIRCUIT

(71) Applicant: Texas Instruments Incorporated, Dallas, TX (US)

(72) Inventors: Farzan Farbiz, Dallas, TX (US); John Eric Kunz, Jr., Allen, TX (US); Aravind C. Appaswamy, Dallas, TX (US); Akram A. Salman, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 15 days.

(21) Appl. No.: 14/221,445

(22) Filed: Mar. 21, 2014

(65) Prior Publication Data

US 2015/0270253 A1    Sep. 24, 2015

(51) Int. Cl.
| | | |
|---|---|---|
| *H02H 3/00* | (2006.01) | |
| *H02H 9/04* | (2006.01) | |
| *H02H 9/00* | (2006.01) | |
| *H01L 27/02* | (2006.01) | |

(52) U.S. Cl.
CPC ................... *H01L 27/0248* (2013.01)

(58) Field of Classification Search
CPC .................. H02H 9/04; H02H 9/041
USPC ........................................... 361/56
See application file for complete search history.

(56) References Cited

U.S. PATENT DOCUMENTS

2012/0092798 A1    4/2012  Hwang
2012/0099228 A1*  4/2012  Lin ..................... H01L 23/60
                                                              361/56

* cited by examiner

*Primary Examiner* — Dharti Patel
(74) *Attorney, Agent, or Firm* — Jacqueline J. Garner; Frank D. Cimino

(57) ABSTRACT

An electrostatic discharge (ESD) protection circuit (FIG. 5A) for an integrated circuit is disclosed. The integrated circuit includes a first ESD cell having a current path coupled between a first terminal and a second terminal. A second ESD cell has a current path coupled between the second terminal and a power supply terminal. A passive circuit is connected in parallel with one of the first and second ESD cells.

7 Claims, 7 Drawing Sheets

PROGRAMMABLE ESD PROTECTION CIRCUIT

BACKGROUND OF THE INVENTION

Embodiments of the present embodiments relate to a programmable electrostatic discharge (ESD) protection circuit. Preferred embodiments of the circuit is intended for use at input, output, input-output, or power supply terminals of an integrated circuit.

Referring to FIG. 1A, there is an ESD protection circuit of the prior art as disclosed by Hwang in U.S. Pub. No. 2102/0092798. The circuit of FIG. 1A illustrates a zenner diode 100 connected in series with a PNP bipolar transistor 104. Resistor 102 is connected as a shunt resistor at the base of PNP transistor 104 to inhibit conduction during normal circuit operation. FIG. 1B discloses the effect of the series connection is to shift the current-voltage characteristic from curve 106 without zenner diode 100 to curve 108 with zenner diode 100. Hwang specifically discloses that the ESD protection circuit has a breakdown voltage equivalent to the bipolar transistor's breakdown voltage plus the zenner diode's breakdown voltage. (paragraph [0021]).

One of the problems of the circuit of FIG. 1A is that it shifts the entire curve 106 to curve 108, and, therefore, may produce a breakdown voltage that exceeds the damage threshold of other circuit components during an ESD event. Various embodiments of the present invention are directed to solving this problem and improving operation of the ESD protection circuit without increasing process complexity.

BRIEF SUMMARY OF THE INVENTION

In a preferred embodiment of the present invention, an electrostatic discharge (ESD) protection circuit for an integrated circuit is disclosed. The ESD protection circuit includes a first ESD cell having a current path coupled between a first terminal and a second terminal. A second ESD cell is coupled between the second terminal and a power supply terminal. A passive circuit is connected in parallel with one of the first and second ESD cells to control a trigger voltage of the ESD protection circuit.

DETAILED DESCRIPTION OF THE INVENTION

The preferred embodiments of the present invention provide significant advantages over electrostatic discharge (ESD) protection circuits of the prior art as will become evident from the following detailed description.

Figure 1A:
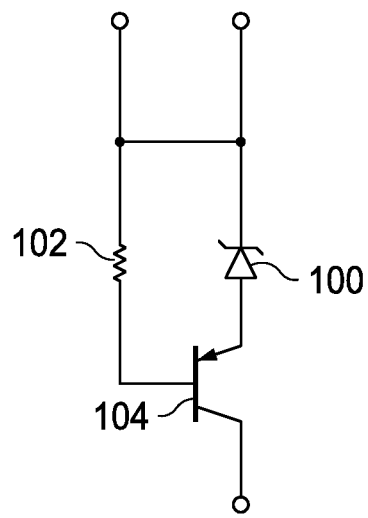
FIG. 1A is a circuit diagram of an electrostatic discharge (ESD) protection circuit of the prior art.
Figure 1B:
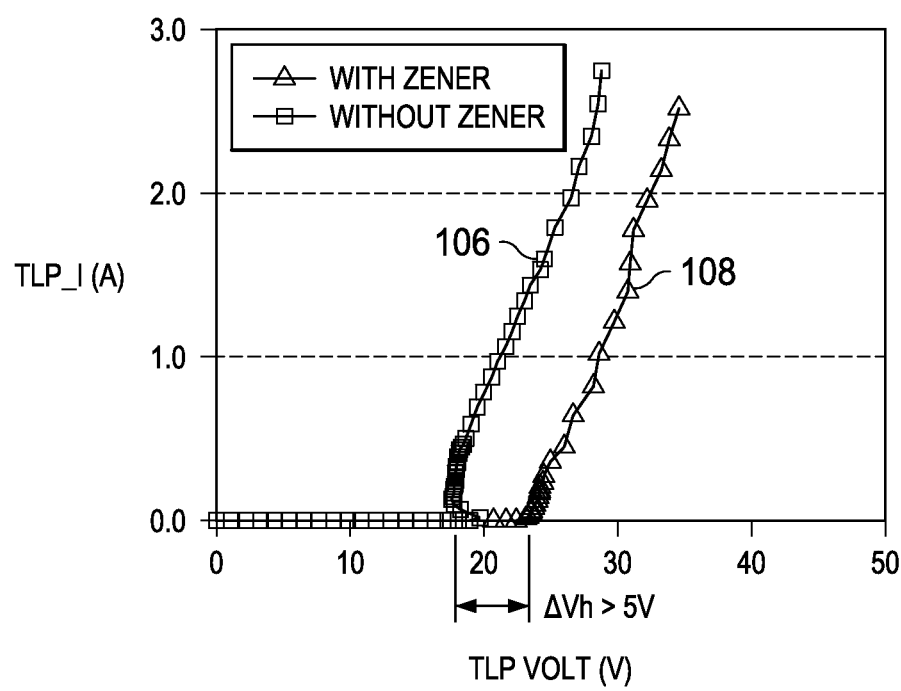
FIG. 1B illustrates transmission line pulse (TLP) current-voltage (IV) wave forms of the circuit of FIG. 1A.
Figure 2A:
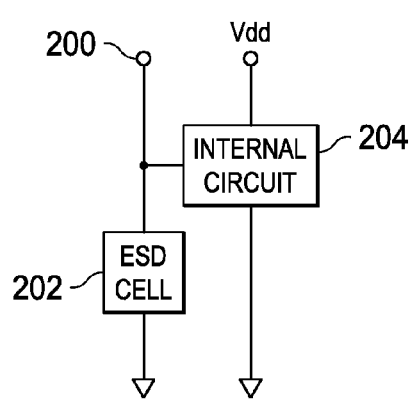
FIG. 2A is a schematic diagram showing an electrostatic discharge (ESD) protection circuit connected to an internal circuit to be protected.
Figure 2B:
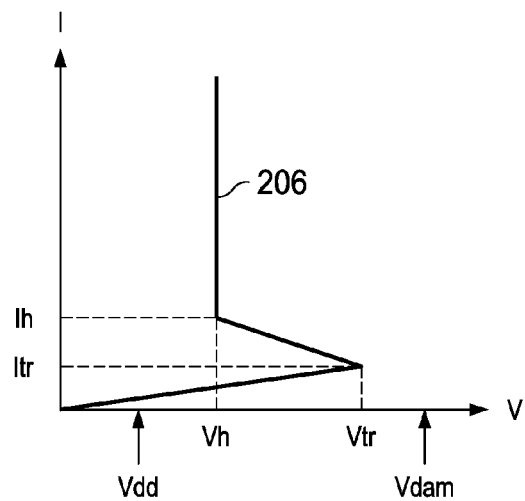
FIG. 2B shows a desirable current-voltage characteristic of the ESD protection circuit of FIG. 2A.

Referring to FIG. 2A, there is a schematic diagram of a representative electrostatic discharge (ESD) protection circuit connected to an internal circuit to be protected. The protection circuit includes an ESD cell 202 connected between terminal 200 and power supply terminal Vss or ground as indicated by the small triangle. Here and in the following discussion, the term cell may be a single device, component, or circuit. Additionally, the same reference numerals are used to indicate substantially the same features. Terminal 200 is connected to protected internal circuit 204 and may be an input terminal, an output terminal, an input-output terminal, or a power supply terminal such as Vdd. Operation of ESD cell 202 is illustrated by the exemplary current-voltage (IV) curve at FIG. 2B. Internal circuit 204 operates at power supply voltage Vdd and has a damage threshold of Vdam. When a positive ESD pulse is applied to terminal 200 with respect to Vss, voltage at terminal 200 increases to trigger voltage Vtr and ESD cell 202 conducts trigger current Itr. The ESD cell then switches to a low impedance state and conducts holding current Ih at holding voltage Vh in the case of a semiconductor controlled rectifier (SCR). Alternatively, Vh may be referred to as a snapback voltage for a bipolar NPN transistor. Current then increases along curve 206 to conduct the ESD current to power supply terminal Vss, thereby protecting internal circuit 204. The slope of curve 206 represents the resistance from the ESD source to the Vss terminal and includes the on resistance of ESD cell 202 as well as parasitic resistance of the discharge path.

In view of the foregoing explanation, it is important that Vtr is less than Vdam so that internal circuit 204 is not damaged. It is also important that Vh is greater than Vdd, so that application of an ESD pulse while Vdd is applied to the circuit will not result in failure of ESD cell 202 or internal circuit 204 due to electrical overstress (EOS) from the Vdd power supply. Finally, it is important that the total resistance from terminal 200 to Vss be as small as practical to minimize power dissipation and heat generation during the ESD event.

Figure 3A:
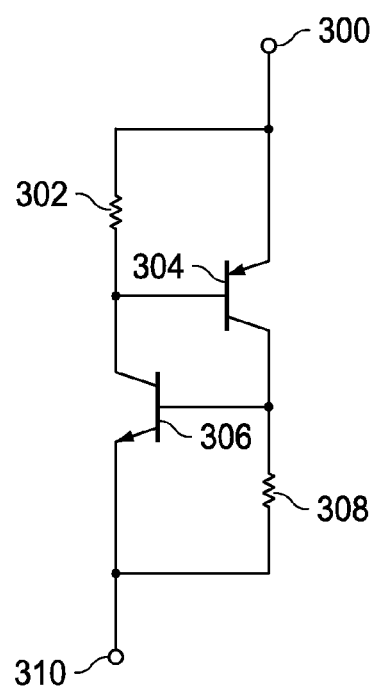
FIGS. 3A-3D show ESD protection cells of the prior art and their respective current-voltage characteristics.
Figure 3B:
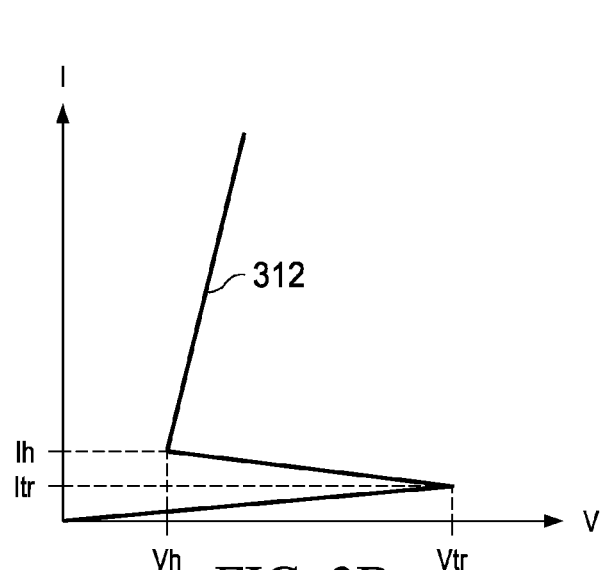

Referring now to FIGS. 3A-3D, there are two ESD protection cells of the prior art and their respective current-voltage characteristics. The cell of FIG. 3A is an SCR formed by PNP bipolar transistor 304 and NPN bipolar transistor 306 connected between terminals 300 and 310. Resistors 302 and 308 are base-emitter shunt resistors for bipolar transistors 304 and 306, respectively. These and other resistors in the following discussion may be formed by various interconnect layers or implanted regions as is well known in the art. Their function is to inhibit conduction of the SCR until an appropriate trigger voltage (Vtr) is developed between terminals 300 and 310. FIG. 3B illustrates the IV characteristic of the cell of FIG. 3A. When a positive ESD pulse is applied to terminal 300 with respect to terminal 310, voltage at terminal 300 increases to trigger voltage Vtr and the SCR conducts trigger current Itr. The ESD cell then switches to a low impedance state and conducts holding current Ih at holding voltage Vh. The ESD cell of FIG. 3A, therefore, is often referred to as a negative resistance cell, since the slope of the curve between Vtr and Vh is negative. Current then increases along curve 312 to conduct the ESD current from terminal 300 to terminal 310.

Figure 3C:
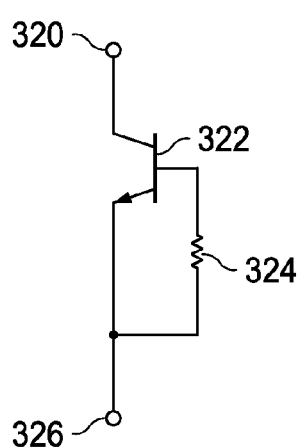
Figure 3D:
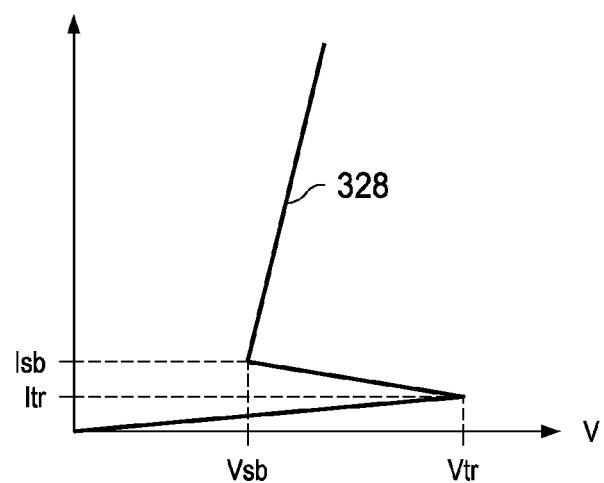

The cell of FIG. 3C includes NPN bipolar transistor 322 connected between terminals 320 and 326. Resistor 324 is a base-emitter shunt resistor designed to inhibit conduction of transistor 322 until an appropriate trigger voltage (Vtr) is developed between terminals 320 and 326. FIG. 3D illustrates the IV characteristic of the cell of FIG. 3B. When a positive ESD pulse is applied to terminal 320 with respect to terminal 326, voltage at terminal 320 increases to trigger voltage Vtr and the transistor conducts trigger current Itr. The ESD cell then switches to a low impedance state and conducts snapback current Isb at snapback voltage Vsb. The ESD cell of FIG. 3C, therefore, is also a negative resistance cell, since the slope of the curve between Vtr and Vsb is negative. Snapback is a term of art to represent a negative resistance transition of the bipolar transistor between BVcbo and BVceo. Here, BVcbo is the open emitter collector-base breakdown voltage, and BVceo is the open base collector-emitter breakdown voltage as is known in the art. The value of Vsb will be greater than BVceo and depends on the transistor gain, the value of resistor 324, and other factors. Current then increases along curve 328 to conduct the ESD current from terminal 320 to terminal 326. The slope of curve 328 represents the resistance from the ESD source to terminal 326 and includes the on resistance of transistor 322 as well as parasitic resistance of the discharge path.

Figure 4A:
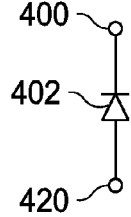
FIGS. 4A-4E show other ESD protection cells of the prior art.
Figure 4B:
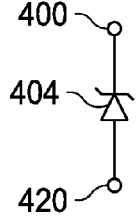
Figure 4C:
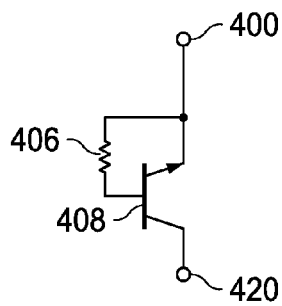
Figure 4D:
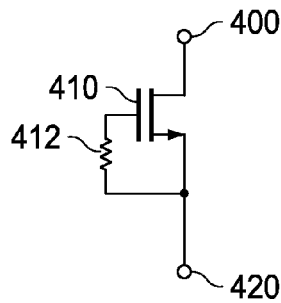
Figure 4E:
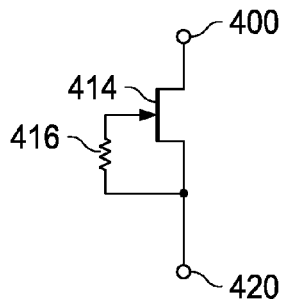

Turning now to FIGS. 4A-4E there are alternative ESD cells of the prior art that may be formed between terminals 400 and 420. FIG. 4A illustrates a PN diode 402 having a cathode at terminal 400 and anode at terminal 420. The PN diode is characterized by a minimum reverse bias conduction voltage or avalanche voltage. FIG. 4B illustrates a zenner diode 404 having a cathode at terminal 400 and anode at terminal 420. The zenner diode is typically formed by adjacent P-type and N-type semiconductor regions having respective impurity concentrations greater than 1e18 Acm$^{-3}$ and is characterized by a minimum reverse bias conduction voltage or zenner voltage. FIG. 4C illustrates a PNP bipolar transistor 408 formed between terminals 400 and 420 having a base-emitter shunt resistor 406. FIG. 4D illustrates an N-channel metal oxide semiconductor (MOS) transistor 410 formed between terminals 400 and 420 having a gate-source shunt resistor 412. The N-channel transistor includes a parasitic NPN bipolar transistor as previously described and may also be considered a negative resistance cell. Alternatively, a P-channel transistor may be substituted for the N-channel transistor for some applications. FIG. 4E illustrates an N-channel junction field effect (JFET) transistor 414 formed between terminals 400 and 420 having a gate-source shunt resistor 416. The N-channel JFET also includes a parasitic NPN bipolar transistor as previously described and is yet another example of a negative resistance cell. Alternatively, a P-channel JFET may be substituted for the N-channel JFET for some applications.

Figure 5A:
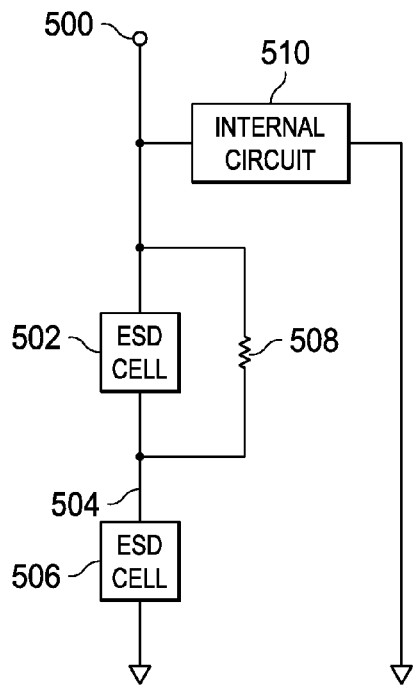
FIGS. 5A-5B show respective first and second embodiments of the present invention.

Referring now to FIG. 5A, there is a first embodiment of an ESD protection circuit of the present invention. The circuit includes a first ESD cell 502 coupled between terminal 500 and terminal 504. A second ESD cell 506 is coupled between terminal 504 and power supply terminal Vss. Bypass resistor 508 is connected in parallel with the first ESD cell 502. A protected internal circuit 510 is connected to terminal 500. Here and in the following discussion, the first and second ESD cells may be any of the cells of FIG. 3A, 3C, or 4A-4E. Moreover, each of the first and second ESD cells may include more than one of the previously discussed ESD cells connected in series as will be explained in detail.

Operation of the ESD protection circuit of FIG. 5A will be explained with reference to the transmission line pulse (TLP) wave forms of FIG. 5C. FIG. 5C shows TLP wave forms for the circuit of FIG. 5A when bypass resistor 508 is omitted and when it has a value of 1 kΩ. When omitted, the ESD protection circuit has a trigger voltage of 21 V. When bypass resistor 508 has a value of 1 kΩ, the trigger voltage decreases to 17.5 V. The value of bypass resistor 508 has little effect on the holding voltage of the ESD protection circuit. ESD cells 502 and 506 are selected to provide a holding voltage or snapback voltage that is greater than the operating voltage of the internal circuit. For example, if the operating voltage of internal circuit 510 is 10 V, the combined holding voltage of cells 502 and 506 is preferably greater than 10 V. If the SCR cell of FIG. 3A is taken as ESD cell 506 and has a holding voltage of 3 V, then ESD cell 502 must have a holding voltage of at least 7 V. If the snapback voltage of the ESD cell of FIG. 3C is 9.5 V it may be used for ESD cell 502. This configuration provides a minimum voltage between terminal 500 and Vss of 12.5 V during an ESD event. The trigger voltage of the ESD circuit is then set by selecting a value of resistor 508. For example, if the damage threshold of internal circuit 510 is 20 V, then resistor 508 may be 1 kΩ to provide a trigger voltage of 17.5 V. Alternatively, resistor 508 may be set to a greater value to increase the trigger voltage or to a lesser value to reduce the trigger voltage. The lower limit, however, is determined by the trigger voltage of cell 506.

During normal circuit operation, ESD cell 506 acts as a blocking circuit so that no current flows between terminal 500 and power supply terminal Vss. During an ESD event, resistor 508 applies a trigger voltage of ESD cell 506 to terminal 504 and conducts a sufficient trigger current to cause ESD cell 506 to switch to the 3 V holding voltage. The resulting increase in voltage between terminals 500 and 504 induces snapback conduction in the NPN ESD cell of FIG. 3C. The holding voltage across ESD cells 502 and 506 during an ESD event, therefore, is 12.5 V. The programmable features of the present invention are highly advantageous over embodiments of the prior art for several reasons. First, the minimum holding voltage of the ESD protection circuit may be set by selection of a combination of series-connected ESD cells. Second, the trigger voltage of the ESD protection circuit may be set by a selected value of resistor 508. Third, the minimum holding voltage is set independently of the maximum trigger voltage. Finally, no special process steps or additional layout area are required.

Figure 7B:
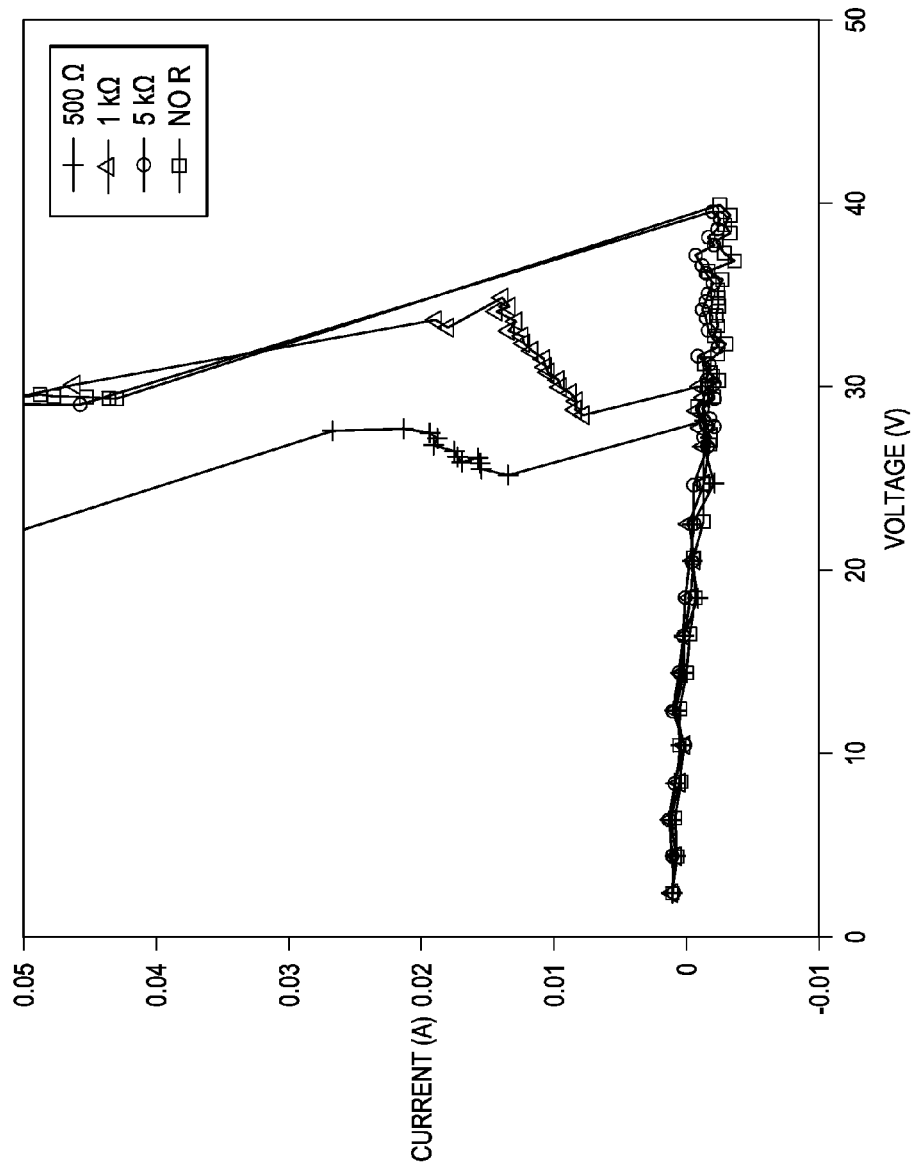
FIG. 7B is a transmission line pulse wave form of the current-voltage characteristics of the circuit of FIG. 7A for various values of resistor 712.
Figure 7A:
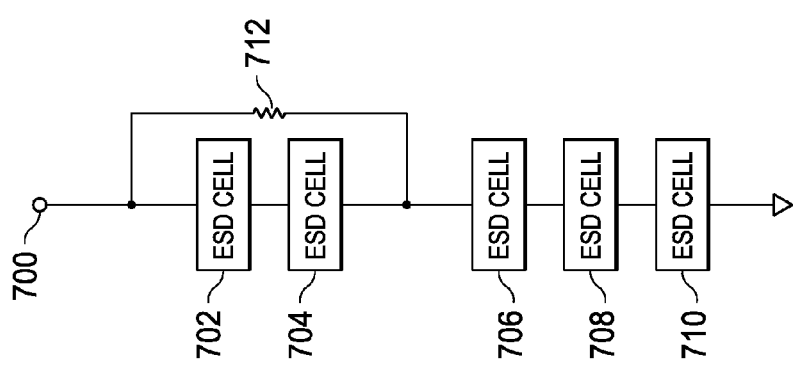
FIG. 7A is an embodiment of the circuit of FIG. 5A invention.

The ESD protection circuit of FIG. 7A is another example of series-connected ESD cells of the present invention. ESD cells 702 and 704 are connected in series and are comparable to ESD cell 502 of FIG. 5A. ESD cells 706 through 710 are connected in series and are comparable to ESD cell 506 of FIG. 5A. ESD cells 702 through 710 may include any of the previously discussed ESD cells of FIG. 3A, 3C, or 4A through 4E to achieve a desired holding voltage. ESD cells 706 through 710 act as a blocking cell during normal circuit operation. Moreover, at least one of ESD cells 706 through 710 is preferably a negative resistance cell so that a transition to holding or snapback voltage will initiate conduction of the entire series circuit. Shunt resistor 712 is then selected to achieve a desired trigger voltage.

Operation of the ESD protection circuit of FIG. 7A is similar to that of ESD protection circuit 5A and will be explained with reference to the transmission line pulse (TLP) curve of FIG. 7B. ESD cells 702 through 710 are selected to provide a holding voltage or snapback voltage that is greater than the operating voltage of the internal circuit. In the following example the minimum holding or snapback voltage is 20 V, and the maximum trigger voltage is 30 V. The SCR cell of FIG. 3A has a holding voltage (Vh) of 3 V and is taken as ESD cells 706 through 710 to provide a total Vh of 9 V. Then series-connected ESD cells 702 and 704 must provide a holding voltage of at least 11 V. If the snapback voltage of the ESD cell of FIG. 3C is 9.5 V, it may be selected for ESD cell 702, and the SCR cell of FIG. 3A may be selected for ESD cell 704. The bipolar NPN (FIG. 3C) provides a snapback voltage of 9.5 V, and the SCR (FIG. 3A) provides a holding voltage of 3 V for a combined minimum Vh of 12.5 V. The combined minimum voltage of ESD cells 702 through 710 is then 21.5 V. The trigger voltage of the ESD circuit is then set by selecting a value of resistor 712. Referring to FIG. 7B, if the maximum desirable trigger voltage is 30 V, then resistor 712 may be 1 kΩ to provide a trigger voltage of 29.8 V. Alternatively, if resistor 712 is set to 500Ω it will provide a trigger voltage of 28.2 V for the ESD protection circuit. It is important to note that any value of resistor 712 greater than 1 kΩ will produce a trigger voltage greater than the desired maximum of 30 V.

Figure 5B:
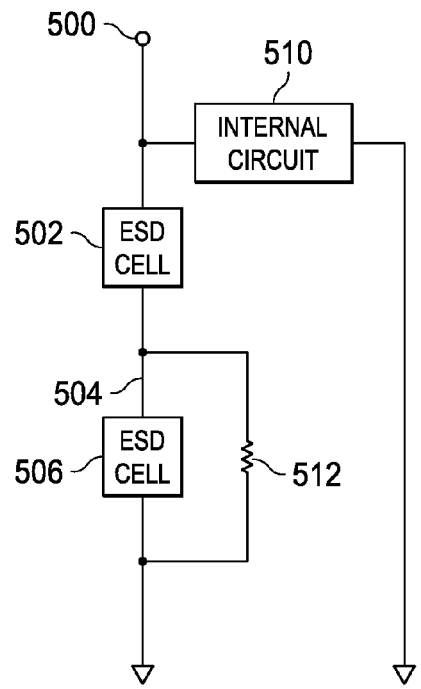
Figure 5C:
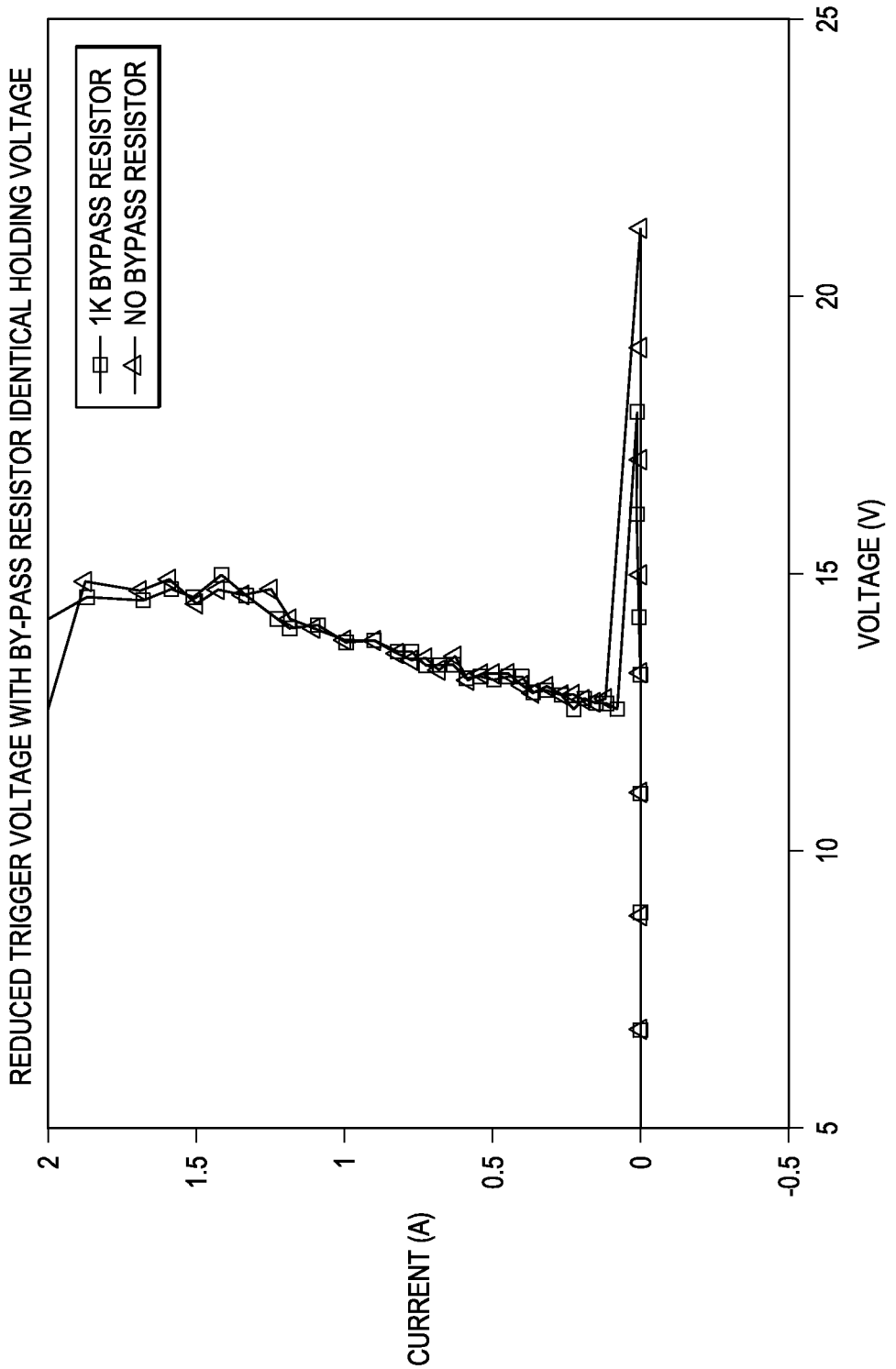
FIG. 5C is a transmission line pulse (TLP) current-voltage (IV) wave form of the circuit of FIG. 5A with and without a 1 kΩ bypass resistor 508.

Referring next to FIG. 5B, there is a second embodiment of an ESD protection circuit of the present invention. The circuit includes a first ESD cell 502 coupled between terminal 500 and terminal 504. A second ESD cell 506 is coupled between terminal 504 and power supply terminal Vss. In this embodiment bypass resistor 512 is connected in parallel with the second ESD cell 506. A protected internal circuit 510 is connected to terminal 500. As previously discussed, the first and second ESD cells may be any of the cells of FIG. 3A, 3C, or 4A-4E. Moreover, each of the first and second ESD cells may include more than one of the previously discussed ESD cells connected in series.

The circuit of FIG. 5B operates in the same manner as the circuit of FIG. 5A except that ESD cell 502 serves as a blocking cell during normal circuit operation and preferably includes at least one negative resistance cell. Resistor 512 is selected to provide a suitable trigger voltage as previously described with regard to FIGS. 5A and 7.

Figure 6A:
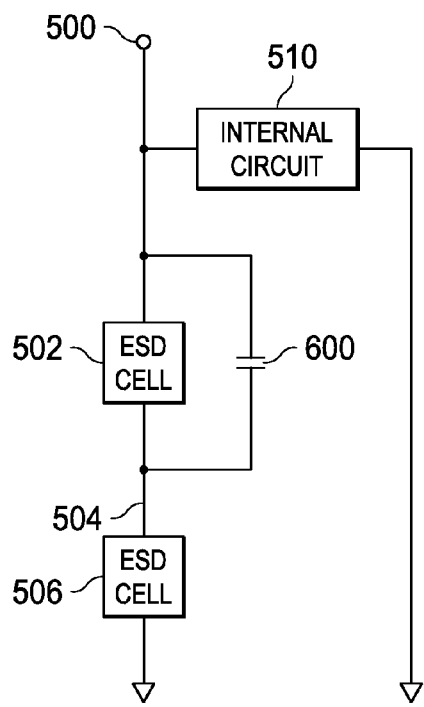
FIGS. 6A-6B show respective third and fourth embodiments of the present invention.

Turning now to FIG. 6A, there is a third embodiment of an ESD protection circuit of the present invention. The circuit includes a first ESD cell 502 coupled between terminal 500 and terminal 504. A second ESD cell 506 is coupled between terminal 504 and power supply terminal Vss. Capacitor 600 is connected in parallel with the first ESD cell 502. A protected internal circuit 510 is connected to terminal 500. As previously noted, the first and second ESD cells may be any of the cells of FIG. 3A, 3C, or 4A-4E. Furthermore, each of the first and second ESD cells may include more than one of the previously discussed ESD cells connected in series.

Operation of the circuit of FIG. 6A will be explained with reference to the transmission line pulse (TLP) wave forms of FIG. 6C. FIG. 6C shows TLP waveforms for the circuit of FIG. 6A when bypass capacitor 600 is omitted and when it is set to 5 pF. When omitted, the ESD protection circuit has a trigger voltage of 21 V. When bypass capacitor 600 has a value of 5 pF, the trigger voltage decreases to 17 V. The value of bypass capacitor 600 has little effect on the holding voltage of the ESD protection circuit. During normal circuit operation, both ESD cells 502 and 506 act as blocking cells so that the ESD circuit remains in a high impedance state. ESD cell 506 preferably includes at least one negative resistance ESD cell. ESD cells 502 and 506 are selected to provide a holding voltage or snapback voltage that is greater than the operating voltage of internal circuit 510. Capacitor 600 is selected to provide an appropriate trigger voltage during an ESD event. For example, when a large trigger voltage is desired, a small value of capacitor 600 is desirable. When a smaller trigger voltage is desirable, a larger value of capacitor 600 is selected. The value of capacitor 600 is selected to couple at least the trigger voltage of ESD cell 506 from terminal 500 to terminal 504 and to provide trigger current Itr in response to an ESD event. The trigger voltage and trigger current at terminal 504 switches ESD cell 506 to a low impedance state at Vh or Vsb. This low impedance state induces conduction of ESD cell 502 so current from the ESD pulse at terminal 500 is conducted to power supply terminal Vss, thereby protecting internal circuit 510.

The ESD protection circuit of FIG. 6A offers the same advantages as the circuit of FIG. 5A. First, the minimum holding voltage of the ESD protection circuit may be set by selection of a combination of series-connected ESD cells. Second, the trigger voltage of the ESD protection circuit may be set by a selected value of capacitor 600. Third, the minimum holding voltage is set independently of the trigger voltage. Finally, no special process steps or additional layout area are required.

Figure 6B:
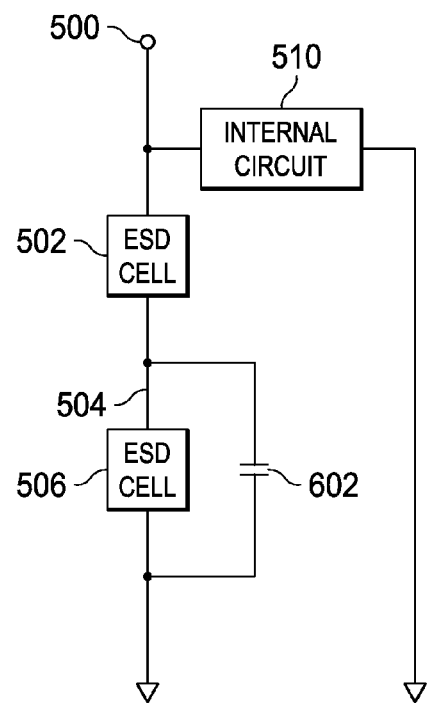
Figure 6C:
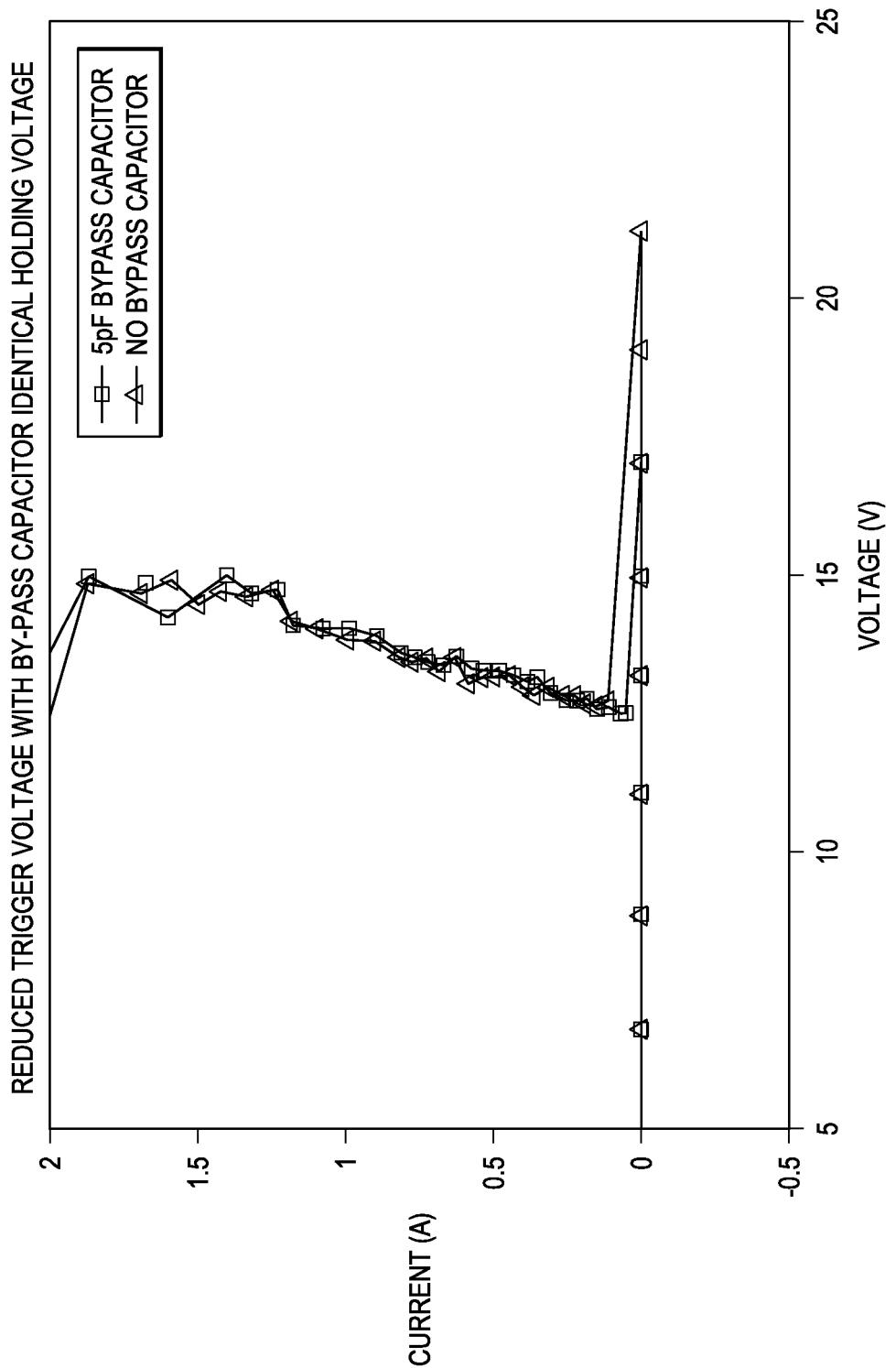
FIG. 6C is a transmission line pulse (TLP) current-voltage (IV) wave form of the circuit of FIG. 6A with and without a 5 pF bypass capacitor 600.

The circuit of FIG. 6B operates in the same manner as the circuit of FIG. 6A except that capacitor 602 is connected in parallel with ESD cell 506 rather than ESD cell 502. Furthermore, ESD cell 502 preferably includes at least one negative resistance ESD cell, such as the ESD cells of FIG. 3A, 3C, 4D, or 4E. As previously discussed with regard to capacitor 600, capacitor 602 is selected to provide a suitable trigger voltage and current in response to an ESD pulse at terminal 500.

Furthermore, although specific examples of bypass resistors and capacitors have been provided, advantages of the present invention may be realized for a wide variety of passive bypass circuits. For example, resistor 508 may be replaced with a bypass inductor to selectively reduce the trigger voltage of the ESD protection circuit. In this case, the rate of change of current with respect to time during an ESD event induces a voltage at terminal 504 sufficient to trigger ESD cell 506. Here, a bypass circuit may be a single device or a combination of devices arranged in parallel or series. For example, the bypass circuit may be an RC, RLC, or diode circuit including other passive circuit elements to set the ESD protection circuit trigger voltage.

Still further, while numerous examples have thus been provided, one skilled in the art should recognize that various modifications, substitutions, or alterations may be made to the described embodiments while still falling within the inventive scope as defined by the following claims. For example, although the foregoing discussion is specifically directed to an ESD protection circuit to conduct ESD current to power supply terminal Vss, embodiments of the present invention may also conduct ESD current to power supply terminal Vdd, or any other suitable power supply or ground terminal. Moreover, although embodiments of the present invention have been discussed separately, it is to be understood that they may be combined to discharge ESD current to either Vss or Vdd power supply terminals in response to the polarity of the ESD pulse. Other combinations will be readily apparent to one of ordinary skill in the art having access to the instant specification.

What is claimed is:

1. An electrostatic discharge (ESD) protection circuit, comprising:
   a first ESD cell having a current path coupled between a first terminal and a second terminal;
   a second ESD cell having a current path coupled between the second terminal and a first power supply terminal;
   a first passive circuit connected in parallel with one of the first and second ESD cells;
   a third ESD cell having a current path coupled between the first terminal and a third terminal;
   a fourth ESD cell having a current path coupled between the third terminal and a second power supply terminal; and
   a second passive circuit connected in parallel with one of the third and fourth ESD cells.

2. A circuit as in claim 1, wherein at least one of the first and second passive circuits comprises a resistor, a capacitor, or an inductor.

3. A circuit as in claim 1, wherein at least one of the first and second passive circuits comprises a diode.

4. A circuit as in claim 1, wherein respective values of the first and second passive circuits determine a respective trigger voltages of the ESD protection circuit.

5. A circuit as in claim 1, wherein at least one of the first through fourth ESD cells comprises plural ESD cells connected in series.

6. A circuit as in claim 1, wherein at least one of the first and second ESD cells and at least one of the third and fourth ESD cells comprise a negative resistance ESD cell.

7. A circuit as in claim 1, comprising an internal circuit to be protected coupled between the first terminal and the first power supply terminal and between the first terminal and the second power supply terminal.

* * * * *